United States Patent
Mazzer et al.

(10) Patent No.: US 9,368,662 B2
(45) Date of Patent: Jun. 14, 2016

(54) PHOTOVOLTAIC JUNCTION FOR A SOLAR CELL

(75) Inventors: Massimo Mazzer, Parma (IT); Thomas Tibbits, Camberwell (GB); Ben Browne, Petersfield (GB)

(73) Assignee: Lumentum Operations LLC, Milpitas, CA (US)

( * ) Notice: Subject to any disclaimer, the term of this patent is extended or adjusted under 35 U.S.C. 154(b) by 469 days.

(21) Appl. No.: 13/820,492

(22) PCT Filed: Aug. 31, 2011
(Under 37 CFR 1.47)

(86) PCT No.: PCT/IB2011/002036
§ 371 (c)(1),
(2), (4) Date: May 17, 2013

(87) PCT Pub. No.: WO2012/028950
PCT Pub. Date: Mar. 8, 2012

(65) Prior Publication Data
US 2013/0269760 A1    Oct. 17, 2013

(30) Foreign Application Priority Data
Sep. 2, 2010    (GB) .................................. 1014606.6

(51) Int. Cl.
*H01L 31/052*    (2014.01)
*H01L 31/18*    (2006.01)
(Continued)

(52) U.S. Cl.
CPC ......... *H01L 31/035236* (2013.01); *B82Y 20/00* (2013.01); *H01L 31/03048* (2013.01); *H01L 31/075* (2013.01); *H01L 31/18* (2013.01); *H01L 31/1848* (2013.01); *Y02E 10/544* (2013.01); *Y02E 10/548* (2013.01)

(58) Field of Classification Search
CPC combination set(s) only.
See application file for complete search history.

(56) References Cited

U.S. PATENT DOCUMENTS 5,073,805 A * 12/1991 Nomura et al. .................. 257/96
5,496,415 A    3/1996 Barnham ....................... 136/255
(Continued)

FOREIGN PATENT DOCUMENTS

| EP | 1072074 | 10/1999 | ................ H01S 3/19 |
| WO | 2007109403 | 9/2007 | ............ H01L 31/117 |

OTHER PUBLICATIONS

"Strained and strain-balanced quantum well deivces for high efficiency tandem solar cells" Ekins-Daukes et al., Solar Energy Materials & Solar Cells vol. 68 (2001) 71-87.
(Continued)

*Primary Examiner* — Devina Pillay
(74) *Attorney, Agent, or Firm* — Harrity & Harrity, LLP

(57) ABSTRACT

A photovoltaic junction for a solar cell is provided. The photovoltaic junction has an intrinsic region comprising a multiple quantum well stack formed from a series of quantum wells separated by barriers, in which the tensile stress in some of the quantum wells is partly or completely balanced by compressive stress in the others of the quantum wells. The overall elastostatic equilibrium of the multiple quantum well stack may be ensured by engineering the structural and optical properties of the quantum wells only, with the barriers having the same lattice constant as the materials used in the oppositely doped semiconductor regions of the junction, or equivalently as the actual lattice size of the junction or intrinsic region, or the bulk or effective lattice size of the substrate. Alternatively, the barriers may contribute to the stress balance.

26 Claims, 13 Drawing Sheets

(51) Int. Cl.
*H01L 31/0352* (2006.01)
*H01L 31/075* (2012.01)
*H01L 31/0304* (2006.01)
*B82Y 20/00* (2011.01)

(56) References Cited

U.S. PATENT DOCUMENTS

| | | | | |
|---|---|---|---|---|
| 5,570,193 | A * | 10/1996 | Landa et al. | 356/442 |
| 5,621,564 | A * | 4/1997 | Kageyama et al. | 359/248 |
| 5,851,310 | A * | 12/1998 | Freundlich et al. | 136/255 |
| 6,437,233 | B1 | 8/2002 | Tran et al. | 136/249 |
| 2003/0089392 | A1 | 5/2003 | Rohr et al. | 136/255 |
| 2003/0145884 | A1 | 8/2003 | King et al. | 136/255 |
| 2004/0175852 | A1 | 9/2004 | Ooi et al. | 438/22 |
| 2005/0247339 | A1 | 11/2005 | Barnham et al. | 136/262 |
| 2008/0219307 | A1 * | 9/2008 | Birkedal et al. | 372/44.01 |
| 2008/0257405 | A1 | 10/2008 | Sharps | 136/256 |
| 2009/0014061 | A1 | 1/2009 | Harris, Jr. et al. | 136/255 |
| 2009/0272438 | A1 | 11/2009 | Cornfeld | 136/261 |

OTHER PUBLICATIONS

J. F. Geisz and D. J. Friedman, III—N-V semiconductors for solar photovoltaic applications, Semiconductor Science and Technology, vol. 17, 2002, pp. 769-777.

PCT Search Report for PCT/IB11/02036 Apr. 30, 2012.

* cited by examiner

PHOTOVOLTAIC JUNCTION FOR A SOLAR CELL

CROSS-REFERENCE TO RELATED APPLICATIONS

This application is the national stage entry of International Appl. No. PCT/IB2011/002036, filed Aug. 31, 2011, which claims priority to Great Britain Patent Application No. 1014606.6, filed Sep. 2, 2010, each of which are incorporated herein by reference for all purposes.

The present invention relates to a photovoltaic junction, for example for use in a solar cell, and in particular, to such a photovoltaic junction in which the intrinsic region contains a plurality of quantum wells formed of one or more materials having a lattice constant different to the actual lattice size of the junction.

In particular, but not exclusively, the invention may be used in III-V semiconductor based concentrator solar cells, for example in such cells having multiple photovoltaic junctions grown monolithically in tandem based on a GaAs, SiGe or Ge substrate or lattice size.

INTRODUCTION

A photovoltaic cell usually comprises two or more layers of semiconductor material from which charge carriers are liberated by incident light, such as sunlight. One or more semiconductor junctions between the layers operate to separate the liberated charge carriers which then move to electrodes thereby providing electrical power.

A photovoltaic junction for a solar cell, incorporating multiple quantum wells in an intrinsic region disposed between p- and n-doped semiconductor layers was disclosed in U.S. Pat. No. 5,496,415. The quantum wells have a smaller band gap than the surrounding bathers and bulk material, enabling the device to absorb photons of longer wavelength. A large volume of experimental work has also demonstrated that the absorption coefficients per unit thickness of material in the quantum wells can be several times larger than the bulk, so that more light can be absorbed for the same thickness of material.

A challenge in constructing multiple quantum well photovoltaic junctions for solar cells is the mismatch between the actual lattice size of the junction (as usually determined by the lattice constant of the substrate material on which the device is grown), the quantum wells, and the barriers. Mismatches in lattice constants of materials used as the layers of the device are grown tend to result in dislocations and other defects in the structure. At sufficiently high levels these defects cause an increase in unwanted recombination of carriers in the intrinsic region, leading to a higher dark current, and a less efficient device. Deeper quantum wells, while being desirable to extend the wavelength region of photons which can be absorbed, usually require use of materials having lattice constants increasingly different from that of the device substrate, increasing the problem.

To construct useful photovoltaic devices, especially for use in solar concentrator systems where illumination levels are typically between 100× and 1000× standard solar intensities, Ekins-Daukes, Solar Energy Materials & Solar Cells 68 (2001) 71-87 proposed using a method of using a series of quantum wells and barriers having opposing compressive and tensile states, with a thickness weighted average lattice constant of the wells and barriers together matching the surrounding bulk materials, enabling a useful device having twenty of more quantum wells to be grown. The technique was refined in US2003/0089392 by also taking into account the elastic properties of each layer, enabling more and/or deeper quantum wells to be used. However, significant stress differential still exists between the barrier and quantum well layers, especially when shifts to longer wavelengths of the well absorption edge are required, leading to the use of well materials with larger lattice mismatches. Moreover, the high degree of compressive strain in the well materials under such circumstances tends to shift the absorption edge slightly to shorter wavelengths, counteracting the desired effect.

It would be desirable to address these and other problems and limitations of the related prior art.

SUMMARY OF THE INVENTION

The invention provides a photovoltaic junction for a solar cell, the junction having an intrinsic region comprising a multiple quantum well stack formed from a series of quantum wells separated by barriers, in which the tensile stress in some of the quantum wells is partly or completely balanced by compressive stress in the others of the quantum wells. The overall elastostatic equilibrium of the multiple quantum well stack may be ensured by engineering the structural and optical properties of the quantum wells only, with the barriers having the same lattice constant as the materials used in the oppositely doped semiconductor regions of the junction, or equivalently as the actual lattice size of the junction or intrinsic region, or the bulk or effective lattice size of the substrate. Alternatively, the barriers may contribute to the stress balance.

The invention may be implemented using some quantum well layers of a first type, which can be formed of one or more diluted nitride materials such as GaNAs materials, the materials of the wells of the first type having a lattice constant less than that of the actual lattice size of the structure, and in particular less than the lattice constants of the barriers and other quantum wells. These wells of a first type are therefore under tensile strain within the multiple quantum well structure. Others of the quantum wells are then of a second type, which can be formed of one or more materials, such as InGaAs materials or other nitrogen free materials, having a lattice constant greater than that of the actual lattice size of the structure. These wells of a second type are therefore under compressive strain.

An interesting feature of diluted nitride semiconductor alloys, such as GaAsN, InGaAsN and GaInPN, GaAsSbN, GaInAsSbN, GaInPSbN, AlInPN, AlInPSbN, GaAlInAsN, GaAlInAsSbN, GaPN, GaPAsSbN, with a nitrogen content lower than about 3%, is that the band gap dependence on nitrogen content is strongly non-linear and for small amounts of nitrogen the band gap decreases significantly with increasing nitrogen content, instead of increasing as one might expect in the case of a linear interpolation between the two limiting compound semiconductors. For instance, the band gap of $GaN_xAs_{1-x}$ decreases with increasing x despite the band gap of GaN being much larger than the band gap of GaAs. This and similar effects can be seen in the lattice constant—band gap diagram of J. F. Geisz and D. J. Friedman, III-N-V semiconductors for solar photovoltaic applications", Semiconductor Science and Technology, vol 17, 2002, pp 769-777. This property of diluted nitrides is even more interesting in view of the fact that, contrary to the overwhelming majority of the III-V semiconductor alloys, a reduction of the band gap corresponds to a reduction of the lattice parameter. This means that quantum wells of GaNAs on GaAs substrates are under tensile strain while quantum wells of InGaAs grown on the same substrate are under compressive strain.

The invention may also provide that barrier or quantum well layers in the quantum well stack that contain nitrogen do not also contain indium, and do not contact any other layers containing indium. In some epitaxial growth conditions, nitrogen may tend to enhance indium segregation effects, leading to poor material quality in layers containing indium, and therefore reduced efficiency of the photovoltaic junction and solar cell.

In designing the quantum well stack, at least one of the first and second types of quantum wells may be tuned, by changing composition and thickness, to reach the absorption edge required for the solar cell. The sequence of quantum wells may be designed and constructed in such as way that at no stage of the deposition is the critical thickness for the generation of misfit dislocations exceeded, and this may lead to a quota of two, three or even four diluted nitride quantum wells being used for each nitrogen free quantum well having similar absorption edge characteristics. Where highly strained quantum wells are required to achieve particular absorption edge characteristics, it may be appropriate to begin growth of the quantum well stack using a subset of the quota of diluted nitride quantum wells, for example up to about half the maximum stress imbalance, followed by one or more nitrogen free quantum wells until the average stress of the stack is about equal in magnitude but with opposite sign, before switching back to complete the quota of nitrogen free quantum wells, then repeating the sequence.

Thicknesses of the barrier and quantum well layers and of the overall quantum well stack may be chosen to maximise the contribution of the multiple quantum well stack to the internal quantum efficiency of the solar cell. In particular, a minimum barrier thickness may be required in order to guarantee a good localisation of confined electronic states and to maximise the absorption coefficient of the wells, while seeking to keep the barrier thickness small to maximise the number of quantum wells which can be fitted into the to intrinsic region of the photovoltaic junction. This limitation is imposed because above a maximum thickness, the built-in electric field of the junction starts to drop thereby dramatically reducing the collection efficiency of photo-generated charge carriers.

A material used for some or all of the barriers may be the same material as is used for one or both of the doped semiconductor regions, and this material may preferably have the same lattice constant as a substrate on which the solar cell is grown monolithically. The doped semiconductor regions may be doped either uniformly, or the doping may be graded in concentration, so that the doping concentration varies through the thickness of the doped semiconductor regions, in order to enhance the electric field penetration into the doped semiconductor regions and improve the voltage performance of the resultant photovoltaic junction.

In prior art stress-balanced quantum well structures, either tensile or compressive stresses in the quantum wells are balanced by the opposite, i.e. either compressive or tensile stresses in the barriers. An advantage of the present invention, in which two types of wells with opposite stress types is used, is that the maximum stress differential between wells and barriers is much reduced. This is particularly important when larger lattice mismatches between the quantum well materials and the actual lattice size are needed, for example to achieve extensions to longer wavelengths of the absorption edge of a photovoltaic junction of a solar cell. In the prior art structures, local breakdown of the lattice coherence can be amplified by the strain differential at the interface between a quantum well and a barrier and trigger a local transition from 2D growth to 3D growth which rapidly propagates both laterally and along the growth direction with the formation of extended regions of highly damaged material, and the invention helps to reduce any such effects by reducing the strain differentials between layers.

In most prior art stress-balanced quantum well structures for solar cells, the quantum wells are under compressive strain, and the combined effects of this compressive strain and quantum confinement act to substantially shift the absorption edge to shorter wavelengths, reducing the degree of the shift to longer wavelengths which the quantum wells are intended to effect. An advantage of the invention, in which wells of a first type are under tensile strain, is to contribute to the shift to longer wavelengths of the absorption edge, and this effect increases with increasing nitrogen concentration in the wells of the first type where these are formed of a dilute nitride III-V material such as GaAsN.

In particular, the invention provides a photovoltaic junction, for example for a solar cell, typically grown monolithically using an epitaxial process. The photovoltaic junction comprises: first and second oppositely doped semiconductor regions; and an intrinsic region disposed between the doped regions, the intrinsic region comprising quantum wells of first and second types and barriers separating each of the quantum wells. The quantum wells of the first type are formed of one or more materials having a lattice constant less than the actual lattice size of the intrinsic region, or of the photovoltaic junction, or of the oppositely doped semiconductor regions, and the quantum wells of the second type being formed of one or more materials having a lattice constant greater than the actual lattice size of the intrinsic region, or of the photovoltaic junction or of the oppositely doped semiconductor regions.

The photovoltaic junction may also be improved by the provision of further doped semiconductor regions with either a higher doping or a higher bandgap, or both, than a doping and a bandgap of the doped semiconductor regions, forming layers known as 'window' or 'front-surface field' at the front side of the junction and/or a 'back-surface field' at the rear side of the junction. These additional doped semiconductor regions put in as cladding on the semiconductor regions, outside of the doped semiconductor regions, serve to improve the photocurrent collection efficiency in the doped semiconductor regions if photons are absorbed in those regions during operation.

A further advantage that may be gained from a photovoltaic junction of the invention would be the inclusion of a mirror, or semiconductor mirror (such as a Bragg reflector) formed of alternate layers of semiconductor material of differing refractive indices n1 and n2 respectively. The Bragg reflector can be placed adjacent to and outside of the doped semiconductor regions, preferably at a back side of the photovoltaic junction (that is, closer to the substrate than the junction). An advantage can be gained from designing the Bragg reflector so as the uppermost layer of the Bragg reflector, closest to the doped semiconductor regions, also acts as the 'back-surface field' region of the photovoltaic junction (an electronic effect), which reduces the amount of semiconductor material required in such a design and also serves to increase the absorption of the MQW region, should photons pass through unabsorbed, they can be reflected and a second possibility of absorption then exists for those photons (a photonic effect). A further advantage may also be gained by designing the lowermost layer of the Bragg reflector, such that it forms one side of the heavily doped tunnel junction which may be required to electrically connect successive junctions within a multiple junction stack. A tunnel junction can also be disposed at a top layer of the Bragg reflector, the closest to the doped semiconductor region.

Where the term lattice constant is used herein for a particular material it is defined herein to refer to the lattice spacing which the material would naturally adopt in the appropriate conditions without either compressive or tensile stress being exerted by adjacent monolithic materials of different lattice constant. The term lattice size, or actual lattice size is defined herein to refer to the lattice spacing which the material adopts under the influence of adjacent monolithic materials which may have different lattice constants or actual lattice sizes.

Typically, the quantum wells of both the first and second types will have a band gap energy of less than that of the doped semiconductor regions, and will have a band gap of less than the barriers. The barriers, which interpose between each of the quantum wells, may typically be formed of the same material as the doped semiconductor regions, for example of GaAs, although embodiments in which a different material is used for the barriers, which may or may not be lattice matched to the doped semiconductor regions, are possible.

The photovoltaic junction may be formed of 111-V semiconductor materials. Typically at least ten and more preferable at least thirty or forty quantum wells are used in the intrinsic region. The intrinsic region, preferably along with at least the doped semiconductor regions, is monolithically grown.

The quantum wells may typically have a thickness of between about 2 nm and 20 nm subject to constraints of stable growth and other factors. To form a junction of good material quality, the tensile stress of the quantum wells of the first type may be balanced by the compressive stress of the quantum wells of the second type. For example, the quantum wells and the barriers may have compositions and thicknesses such that the plurality of quantum wells alone, or a combination of the wells and barriers, provide compensating compressive and tensile stresses which balance at the actual lattice size of the photovoltaic junction. A detailed discussion of how this may be achieved in the context of quantum wells and barriers balanced by compressive stress and tensile stress respectively, for example by taking into account the elasticity properties of the balancing layers as well as thicknesses and lattice constants, may be found in US2003/0089392, the subject matter of which is incorporated herein by reference in its entirety.

Although perfect balance is not attainable in any practical implementation, balanced stresses at a nominal lattice size within a deviation of about ±0.1%, or 1000 ppm of the actual lattice size, which itself will typically be constrained by the underlying substrate, may be considered herein as balanced or substantially balanced, although finer tolerances, for example to within 200 ppm may be used. Similarly, where terms such as lattice matched are used herein, or one lattice constant, size or spacing is said to be the same as another, practical tolerances should be considered, for example with differences of up to about ±0.1% in lattice spacing being acceptable.

Some particular combinations of materials which may be used to implement the invention include:
  barriers of GaAs, quantum wells of the first type of either GaAsN or InGaAsN, and quantum wells of the second type of InGaAs. Such materials may be used in an intrinsic region lattice matched to GaAs, for example for use in a device based on or having a GaAs substrate;
  barriers of GaInP, wells of the first type of GaAsP, and wells of the second type of GaInP. Such materials may also be used in an intrinsic region lattice matched to GaAs, for example with the barrier GaInP being lattice matched in this way;
  barriers of GaAsP, wells of the first type of GaAsN, and wells of the second type of InGaAs. Using such materials the intrinsic region may as a whole be lattice matched to GaAs, with the barriers having a lattice constant less than GaAs to thereby contribute to the compressive stress balanced by the wells of the second type;
  barriers of InGaAs, wells of the first type of GaAsN, and wells of the second type of InGaAs. Conveniently, about 1% indium in the barriers may be used to lattice match the barriers to germanium, with the stresses in the wells of the first and second types balancing, so that the intrinsic region as a whole is lattice matched to germanium, for example for use in a device based on or having a germanium substrate. Adjustments to the indium fraction may be made, for example for use of the invention with a SiGe substrate where an increasing proportion of silicon increases the lattice size;
  barriers of GaP, wells of the first type of GaPN, and wells of the second type of GaInP. GaP is closely lattice matched to silicon, so this structure may conveniently be used to form an intrinsic region for use with, or lattice matched to, a silicon substrate;
  barriers of GaAs or SiGe, wells of the first type of SiGeSn, and wells of the second type of Ge or SiGe. This scheme can be used to form a very low energy system.

In one particular example, the quantum wells of the first type are formed of GaAsN and have an absorption edge of at least 1050 nm, for example around 1100-1120 nm, the quantum wells of the second type are formed of InGaAs and have an absorption edge of at least 900 nm, for example around 925-945 nm, and the barriers and doped semiconductor regions are formed of GaAs. Three quantum wells of the first type may be used to balance the stress of each quantum well of the second type.

In another particular example, the quantum wells of the first type are formed of GaAsN and have an absorption edge of at least 900 nm, for example about 945-965 nm, the quantum wells of the second type are formed of InGaAs and have an absorption edge of at least 1050 nm, for example about 1085-1105 nm, and the barriers and doped semiconductor regions are formed of GaAs. Four quantum wells of the first type may be used to balance the stress of each quantum well of the second type.

In another particular example, the quantum wells of the first type are formed of GaAsP and have an absorption edge of at least 750 nm, for example about 790-810 nm, the quantum wells of the second type are formed of GaInP and have an absorption edge of at least 650 nm, for example about 685-705 nm, and the barriers and doped semiconductor regions are formed of a GaInP material. One quantum well of the first type may be used to balance each quantum well of the second type.

In each of these three examples the barrier thicknesses may be about 6 nm, although barrier thicknesses of about 2 nm to 20 nm may be suitable in various embodiments of the invention. More generally, the materials of the quantum wells of the first type may contain nitrogen, and in particular may be diluted nitride III-V semiconductor materials, for example having a nitrogen proportion of less than 3%. An example material which may be used is GaAsN. The increasing nitrogen content in such materials gives rise to both a smaller band gap, and hence a longer wavelength absorption band edge, and a smaller lattice constant. The quantum wells of the second type may then contain indium to also provide a longer wavelength absorption band edge, and a larger lattice constant, with the two types of quantum wells arranged to have tensile and compressive stresses which partially or completely balance each other. An example material which may be used for wells of the second type is InGaAs, or GaAsSb. Advantageously, the quantum wells and barriers may be arranged such there are no interfaces between diluted nitride or other materials formed with a nitrogen component, and materials containing indium, in the quantum well stack. To this end, the barriers may be formed of materials which are substantially nitrogen free such as GaAs, and the materials of the quantum wells of the second type may also be substantially nitrogen free, but contain indium. In this context, being substantially free of nitrogen or indium could be considered as having a molar fraction of less than, for example 0.1%. Suitable materials which contain indium but which are nitrogen free include InGaAs, InGaAsSb, GaInP, InGaAsP, InGaPSb, AlInGaAs, AlInGaP, and AlInGaAsSb.

Because of the rapid decrease in band gap of the diluted nitride materials with decreasing lattice constant, compared with the usual less rapid decrease in band gap with increasing lattice constant when indium is increased in III-V semiconductor materials, more quantum wells of the first type are preferably used in the intrinsic region than quantum wells of the second type. In particular, a plurality of wells of the first type may be disposed between one or more pairs of quantum wells of the second type. In some embodiments, the number of wells of the first type is twice, or at least twice, the number of wells of the second type.

To improve the stability of the intrinsic region, the first and last quantum wells of the intrinsic region may be grown to a fraction of the thickness, in particular about half the thicknesses of other quantum wells of the same types as the first and the last quantum wells respectively in the intrinsic region.

The invention also provides a solar cell comprising a first photovoltaic junction as set out above. One or more further photovoltaic junctions, any or each of which may also embody the invention as set out above, may be formed monolithically in tandem with, and either or both of above and below the first photovoltaic junction. For example, the first photovoltaic junction may be the bottom junction in a triple junction tandem solar cell. In this case, the first photovoltaic junction may have an absorption edge conferred by at least some of the quantum wells of at least 1250 nm.

In another example, the first photovoltaic junction may lie above a germanium based photovoltaic junction in a four junction tandem solar cell and below other photovoltaic junctions in the solar cell. In this case, the first photovoltaic junction may have an absorption edge conferred by at least some of the quantum wells of at least 1050 nm The first photovoltaic junction may be lattice matched to GaAs or Ge. A third junction overlying the first junction may be based on AlInGaAs materials, and a fourth junction overlying the third junction may be based on (Al)InGaP materials. In another example, the first photovoltaic junction may be the top cell in a multiple junction tandem solar cell. In this example, the top cell may be based on phosphide materials, for example with the barriers and the doped semiconductor regions being formed of a phosphide material such as GaInP, which advantageously may be lattice matched to GaAs or Ge.

The solar cell will generally comprise a substrate, or will have been grown on a substrate, and such a substrate may, for example, be one of: a GaAs substrate; a Ge substrate; a SiGe substrate; a Si substrate; and a substrate having a growth surface lattice matched to GaAs, Ge or Si, for example a virtual substrate; and a "spinel" substrate, where the substrate is formed of a material from the group of spinels, for example, $Mg_2AlO_4$.

The invention also provides a photovoltaic system for generating electrical power from solar illumination comprising: a solar cell as set out above; and a concentrator arranged to deliver concentrated sunlight to the surface of the solar cell. For example, the concentrator may be arranged to deliver sunlight concentrated by at least 50 times, and the one or more solar cells may be concentrator solar cells adapted to operate under such conditions.

The invention also provides a method of forming a solar cell comprising epitaxial growth of a first photovoltaic junction as set out above, and may further comprise carrying out epitaxial growth of one or more further photovoltaic junctions monolithically with said first photovoltaic junction.

The invention also provides a method of providing an extended absorption edge in a photovoltaic junction, which includes an intrinsic region having multiple quantum wells therein, comprising forming a first subset of said wells from a diluted nitride material which is indium free, forming a second subset of said wells from a material which contains indium, and separating the first and second subsets of quantum wells using barriers which are free from both nitrogen and indium. The barriers may be formed of GaAs. The substrate for the junction may be GaAs or some other material such as Si, Ge, or SiGe, or InP. The junction also comprises oppositely doped semiconductor regions disposed above and below said intrinsic region, and these doped semiconductor regions may also be formed of GaAs. The first subset of wells may be in tensile stress and the second subset of wells may be in compressive stress, with the quantum wells being arranged such that the compressive and tensile stresses balance, for example as already discussed above. Nitrogen containing materials that could be used to make quantum wells in this invention include:

GaAsN, GaPN, GaSbN, InAsN, InPN, InSbN, GaInAsN, GaInPN, GaInSbN, GaInAsPN, GaInAsSbN, GaInPSbN, GaAsPNSb, InAsPNSb, GaInAsPNSb, where Al could also be added to any of the above materials.

Nitrogen free materials that could be used to make wells of the second type (with, or without In as necessary for avoidance of segregation) include:

GaAs, InAs, GaP, GaSb, InP, InSb, GaAsP, GaPSb, InAsP, InAsSb, InPSb, GaInAs, GaInP, GaInSb, GaAsPSb, InAsPSb, GaInAsP, GaInAsSb, GaInPSb, GaInAsPSb, where Al could also be added to any of the above materials.

BRIEF DESCRIPTION OF THE DRAWINGS

Embodiments of the invention will now be described, by way of example only, with reference to the accompanying drawings, of which:

FIG. 4 is a graph showing cumulative lattice mismatch through a structure such as that shown in FIG. 3a;

DETAILED DESCRIPTION OF EMBODIMENTS

Figure 1:
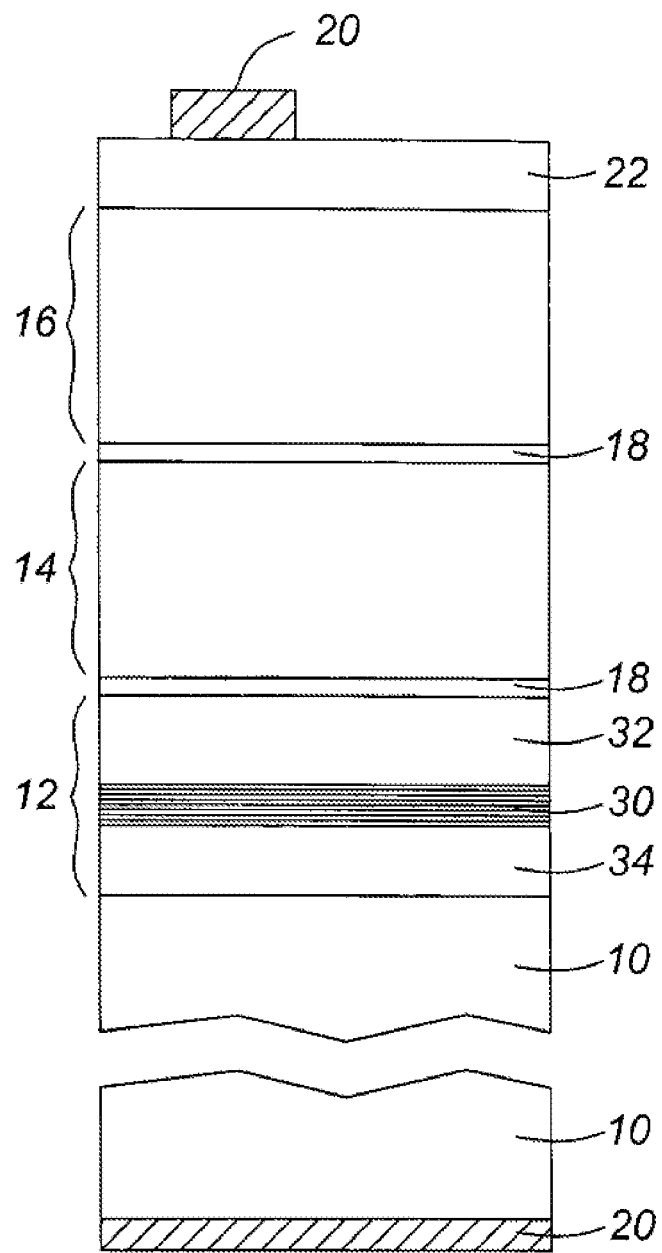
FIG. 1 illustrates in schematic cross section a monolithically grown solar cell comprising three photovoltaic junctions in a tandem configuration, and incorporating a photovoltaic junction having an intrinsic region 30 comprising a multiple quantum well stack embodying the invention.

Referring now to FIG. 1, epitaxially grown layers of a solar cell according to a first embodiment of the invention are shown schematically in cross section. Not all layers are necessarily shown in the figure, and the layer thicknesses are not intended to be to scale. Broadly, the cell comprises a substrate 10 on which are formed one or more photovoltaic junctions. In this example, three photovoltaic junctions 12, 14, 16 are shown, but any suitable number may be used as required. The photovoltaic junctions are coupled using tunnel junctions 18, so that a common photocurrent passes through all of the junctions, for collection using electrodes 20 typically disposed beneath the substrate 10 to and on top of a window layer 22 overlying the uppermost photovoltaic junction 16. The photovoltaic junctions and other semiconductor layer structures are formed on the substrate using an epitaxial process such as chemical vapour deposition, to form a monolithic structure.

The substrate may typically be GaAs, but a variety of other substrates may also be used including Ge, SiGe, Si, and a spinel substrate mentioned above, and virtual substrates providing a surface for device growth which is lattice matched to any of these materials.

At least one of the photovoltaic junctions, in this case junction 12, is a junction having an intrinsic region 30 comprising a plurality of quantum wells separated by barriers, and having quantum wells and barriers formed of particular materials and in particular arrangements according to the invention. The quantum wells are usually constructed with the intention of extending the absorption edge of the photovoltaic junction to longer wavelengths, in particular by using a material having a lower energy band gap than other parts of the photovoltaic junction. The intrinsic region 30 is disposed between oppositely doped semiconductor regions 32, 34.

Figure 3A:
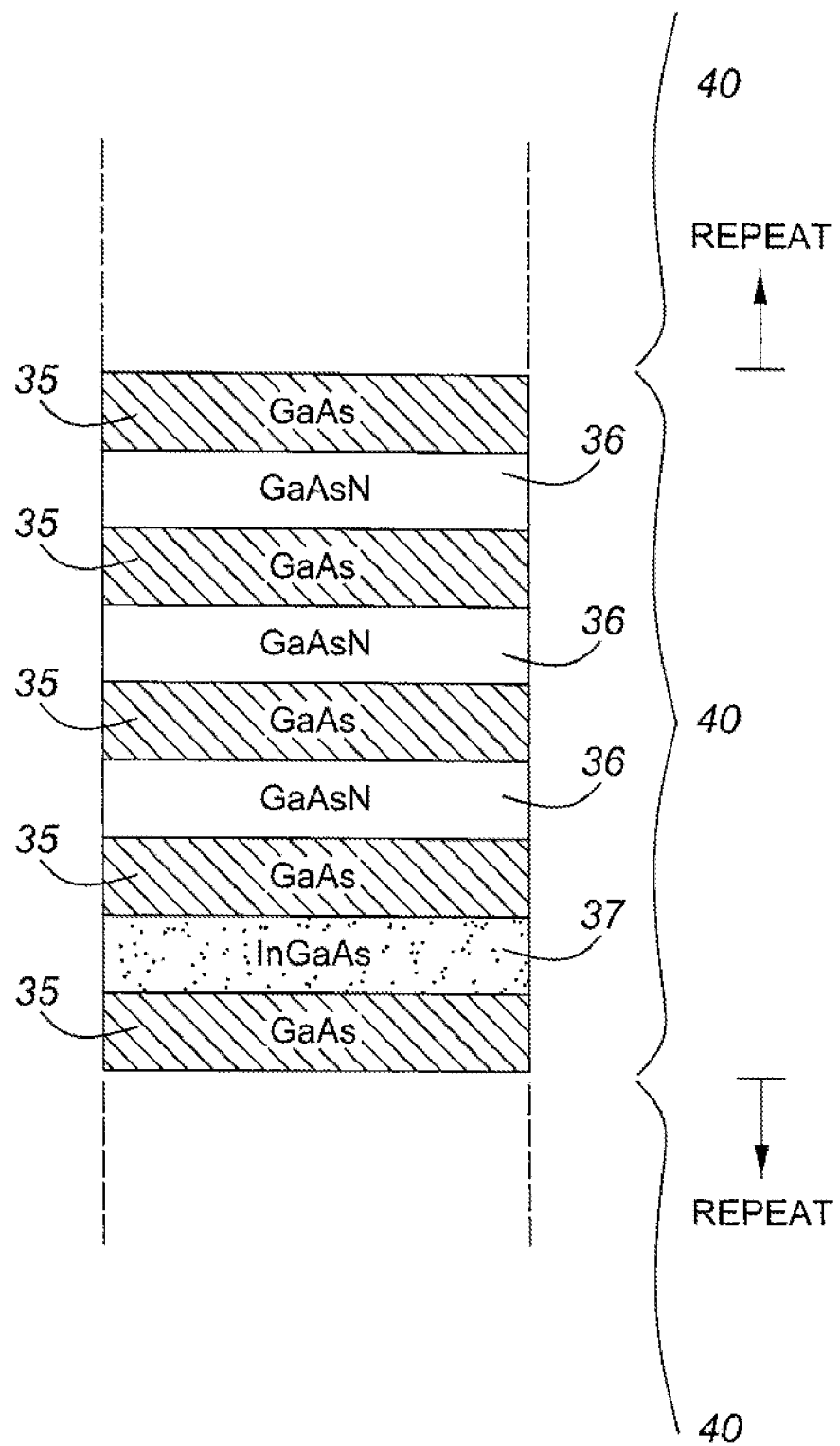
FIGS. 3a to 3f show particular materials and sequences for quantum wells and barriers for use in the intrinsic region of FIGS. 1 and 2.
Figure 3B:
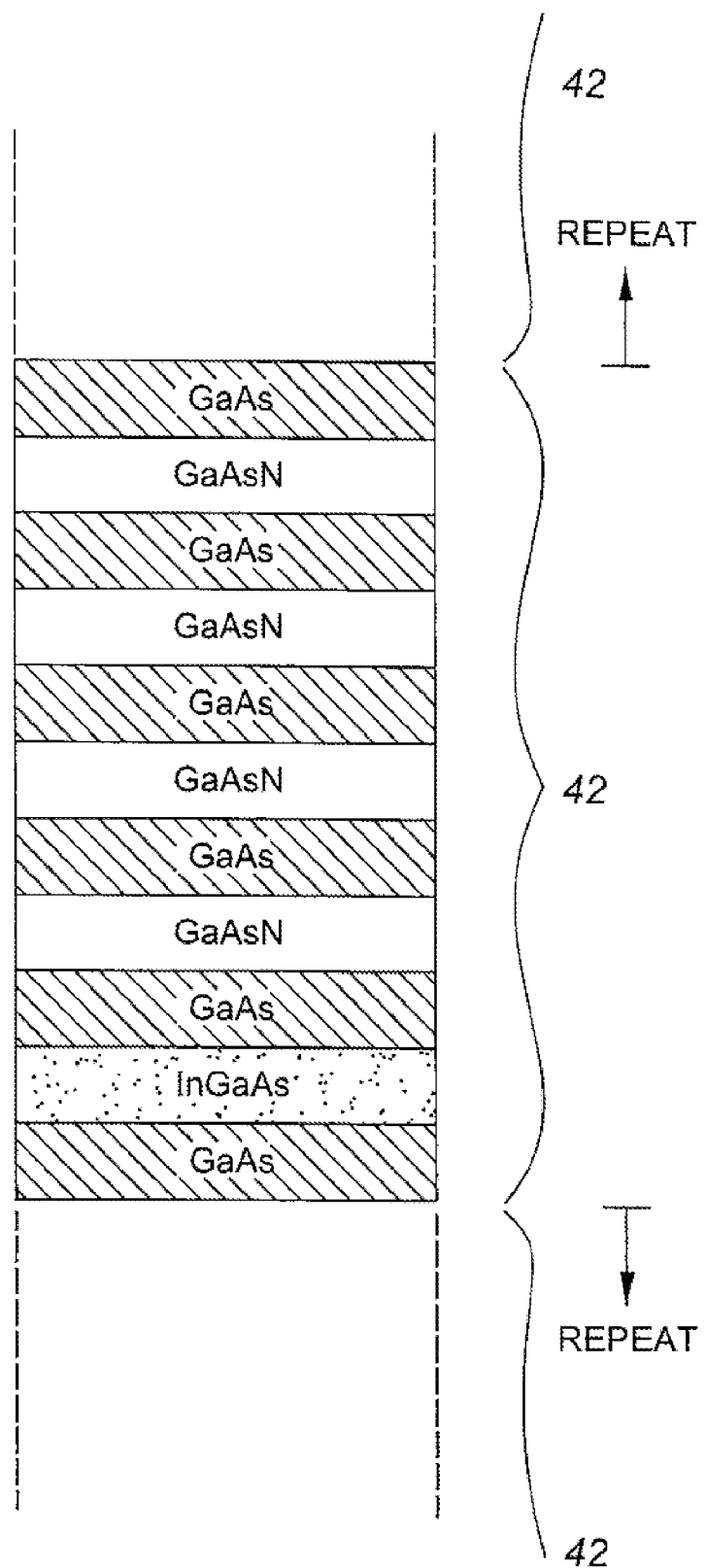
Figure 3C:
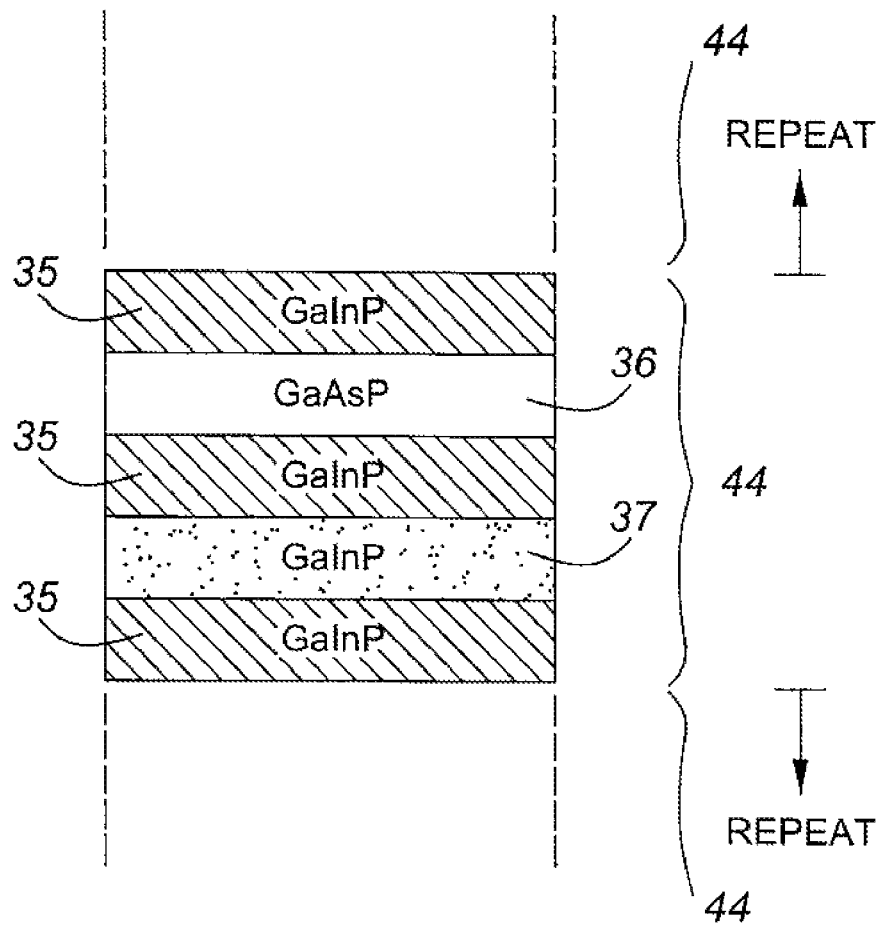

Particular examples of locations in which a photovoltaic junction 12 according to the invention may be used include: in the bottom subcell of a triple tandem junction solar cell, with quantum wells in the bottom subcell including materials with an absorption edge at around 1300 nm; above a germanium based bottom subcell in a quadruple tandem junction solar cell, with quantum wells in including materials with an absorption edge at around 1300 nm; and in the top cell of a multi-junction tandem solar cell, for example using the phosphide based configuration illustrated in FIG. 3c.

Figure 2:
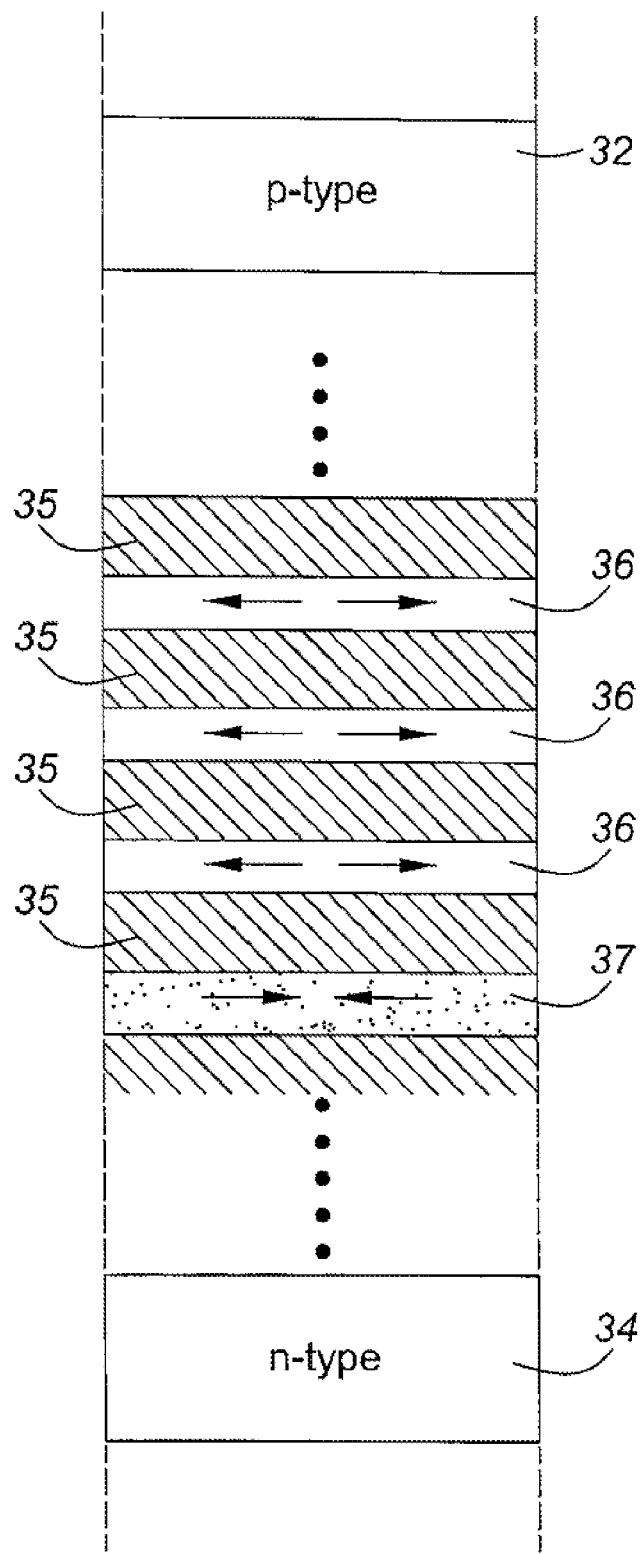
FIG. 2 illustrates in more detail the intrinsic region 30 of FIG. 1.

A structure which may be used in the intrinsic region is shown in FIG. 2. The structure includes barriers 35, which separate quantum wells 36, 37, to form a quantum well stack. The quantum wells of FIG. 2 are of two types. Quantum wells of the first type 36 are formed of one or more materials which have a lattice constant which is smaller than the actual lattice size of the structure, and quantum wells of the second type 37 are formed of one or more materials which have a lattice constant which is larger than the actual lattice size of the structure. The barriers 35 which separate the quantum wells may be formed of one or more materials which have a lattice constant which matches the actual lattice size of the structure, or which is mismatched to the actual lattice size of the structure but preferably between the lattice constants of the quantum wells of the first and second types.

The compressive and tensile stresses arising from the mismatch between the lattice constants of the first and second quantum well types and the actual lattice size of the structure are illustrated by the horizontal arrows in FIG. 2. The tensile stresses induced in the wells of the first type are compensated in part or in whole by the compressive stresses induced in the wells of the second type. Preferably, the structure is formed so that the overall stress, taking into account the elastic coefficients, thicknesses, and material compositions of each layer, is as small as possible, or substantially nulled, thereby improving the material quality and therefore also the efficiency of operation of the junction 12. An established use of quantum well structures in solar cell junctions is to extend the absorption edge of the junction to longer wavelengths, and to this end materials used in either or both of the first and second quantum well types may have a lower energy band gap than the doped semiconductor regions 32, 34.

The barriers and quantum wells may be arranged in a series of regular unit groupings with the same ordering repeated multiple times. However, this is not essential, and other, less regular orderings may be used. To better balance the stresses exerted by the barriers and wells at the top and bottom of the intrinsic region, the lowest or first, and highest or last barrier may be of reduced thickness, for example half the thickness of other barriers in the quantum well stack of the same type.

Figure 5A:
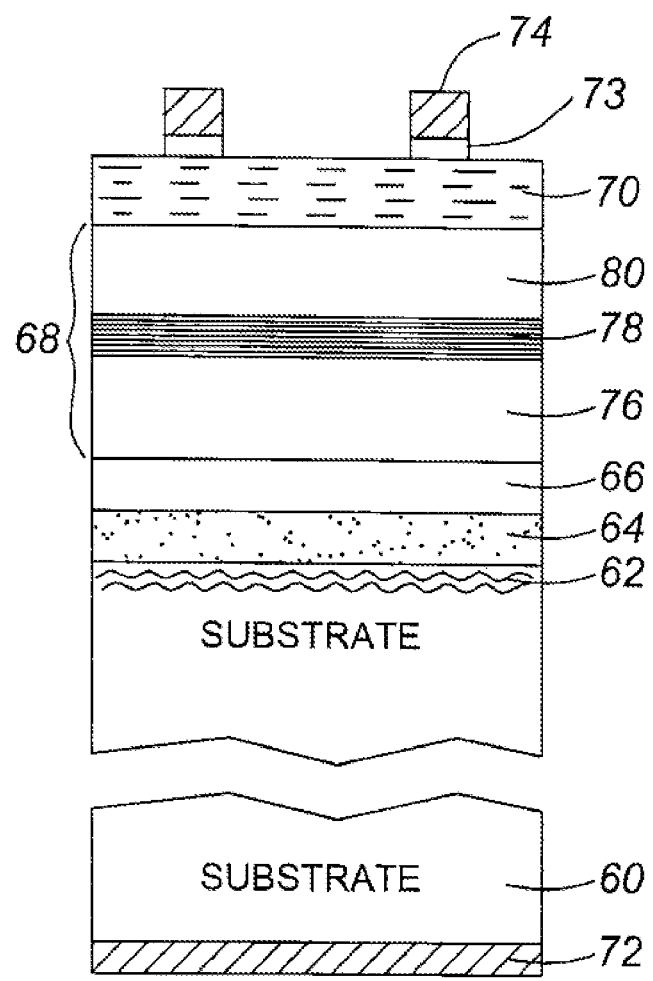
FIGS. 5a and 5b show a solar cell also using the intrinsic region of FIG. 2.
Figure 5B:
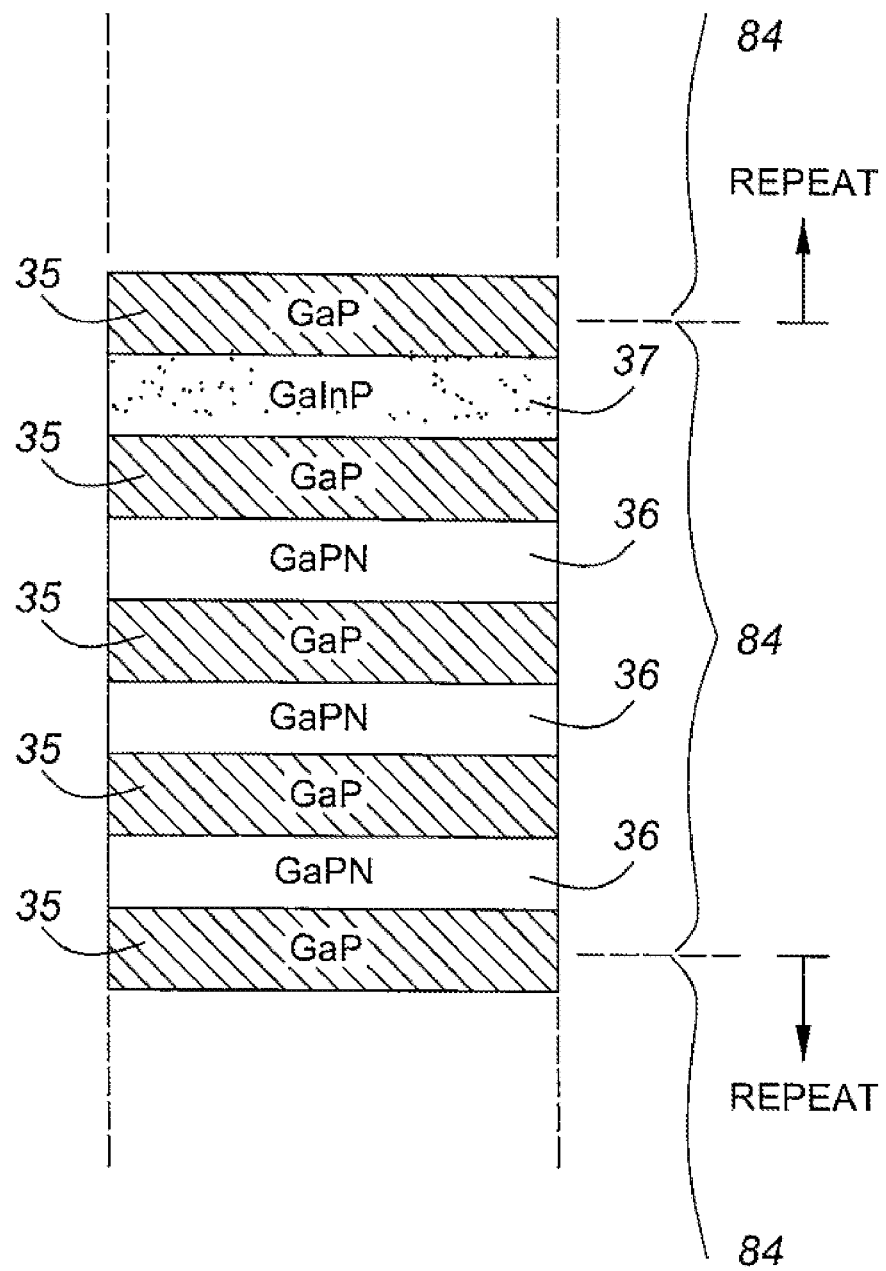

Six particular examples of structures which may be used in the intrinsic region 30 are shown in FIGS. 3a to 3f, which use common reference numerals and shading with FIG. 2 to show barriers and wells of different types, this scheme also being used in FIG. 5b. In FIG. 3a a unit grouping 40 is shown in which each barrier is formed of GaAs. Wells of the first type are formed of a GaAsN material, and wells of the second type are formed of a InGaAs material. The particular material compositions selected for this example are $GaAs_{0.981}N_{0.019}$ and $In_{0.11}Ga_{0.89}As$. The particular thicknesses selected are 6 nm for the barriers, 7 nm for the wells of the first type and 11 nm for the wells of the second type. Three wells of the first type are used to balance the compressive stress in each well of the second type while remaining well within the critical thicknesses for stable growth of the layers. The unit grouping 40 is repeated up to about 44 times to provide the full quantum well structure for the intrinsic region 30 of the junction 12, although a regular ordering of the different quantum well types is not essential. Generally, it is desirable to form a quantum well structure containing a maximum thickness of the quantum wells in order to give the strongest absorption of light at the extended absorption wavelengths which the quantum wells provide, but the quantum well structure is limited to around 2500 nm in thickness to maintain the intrinsic properties of the region in the presence of low and unavoidable levels of contaminant dopants.

The quantum well structure of FIG. 3a is disposed between the oppositely doped layers of GaAs to form the photovoltaic junction 12. The absorption edges of the $GaAs_{0.981}N_{0.019}$ and $In_{0.11}Ga_{0.89}As$ and materials are about 1112 nm and 935 nm respectively, compared with an absorption edge for GaAs of about 870 nm. It will be seen that the illustrated structure is able to provide a quantum well structure in which about 57% of the thickness is quantum well material of an extended band edge, and in which about 38% of the thickness has a band edge beyond 1100 nm.

In FIG. 3b a different unit grouping 42 is shown in which the barriers and first and second well types are also of GaAs, GaAsN and InGaAs materials respectively, but in which the indium content of the second well type is increased by using a material of composition $In_{0.35}Ga_{0.65}As$. This extends the absorption edge of the wells of the second type to about 1094 nm, but restricts the thickness of each such well, with a thickness of about 2.5 nm being used. The nitrogen content of the wells of the first type is reduced with $GaAs_{0.995}N_{0.005}$ being used in four layers each of about 13 nm thickness and having an absorption edge at about 953 nm.

In the examples of FIGS. 3a and 3b a diluted nitride material GaAsN is used to provide the first well type. FIG. 3c shows a different unit grouping 44 in which the barriers are formed of a GaInP material closely lattice matched to GaAs, and the first type quantum wells are formed of a GaAsP material having a lattice constant which is smaller that the barriers. The second type of quantum wells are also formed of a GaInP material, but with a lattice constant which is larger than that of the GaInP barrier material, a property which is conferred by providing the wells of the second type with a higher indium content than the barriers. The particular material compositions selected for this example are $Ga_{0.515}In_{0.485}P$ for the barriers each with a thickness of about 6 nm, $GaAs_{0.848}P_{0.152}$ for wells of the first type which provides an absorption edge of about 799 nm, and $Ga_{0.4}In_{0.6}P$ for wells of the second type which provides an absorption edge of about 695 nm. Suitable thickness for the wells of the first and second types are about 8.5 nm and 6 nm respectively, and each type of well is repeated once within the unit grouping 44. The example of FIG. 3c is suitable, for example, to provide a quantum well structure for the intrinsic region of a photovoltaic junction in which GaInP is used for the doped semiconductor regions, as is typical in one of the upper junctions in a tandem multi junction solar cell lattice matched to GaAs or Ge.

Figure 3D:
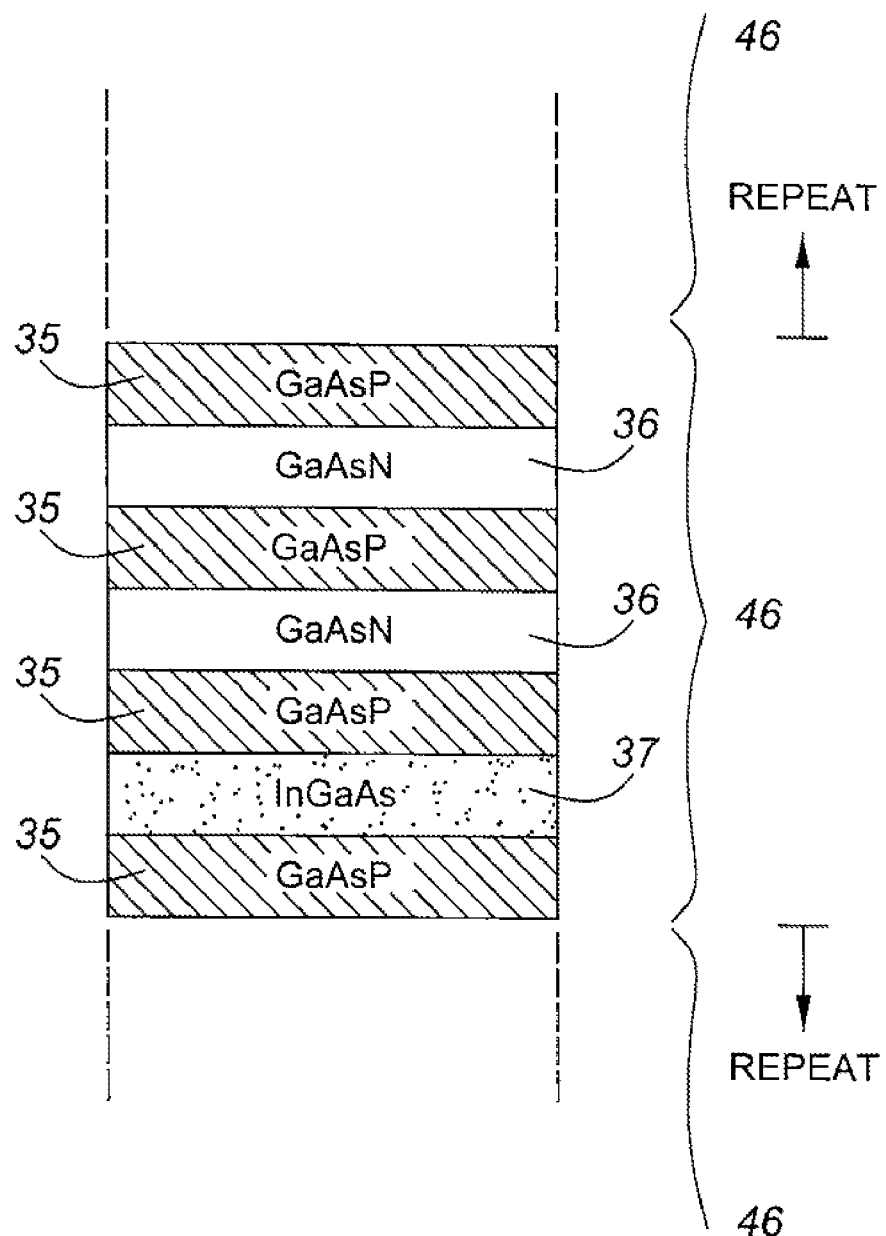

In the examples of FIGS. 3a to 3c the barriers are formed of a material with is lattice matched to the doped semiconductor regions of the junction, and to the actual lattice size of the structure. However, the barriers may instead be formed of a material which is mismatched to the actual lattice size, to contribute either to the tensile or compressive stresses exerted by the quantum wells, as long as the total stress exerted by the wells and barriers remains balanced. FIG. 3d illustrates a unit grouping 46 which overall is lattice matched to GaAs, and in which the barriers are formed of a GaAsP material having a smaller lattice constant than GaAs. Wells of the first type are formed of a GaAsN material also having a smaller lattice constant than the actual lattice size of the structure, and wells of the second type are formed of an InGaAs material having a larger lattice constant. The contribution of the barriers in FIG. 3d to the compressive stress is compensated by a reduced number of wells of the second type, with only two such wells being used for each well of the first type, compared to FIG. 3a where the ratio is three.

Figure 3E:
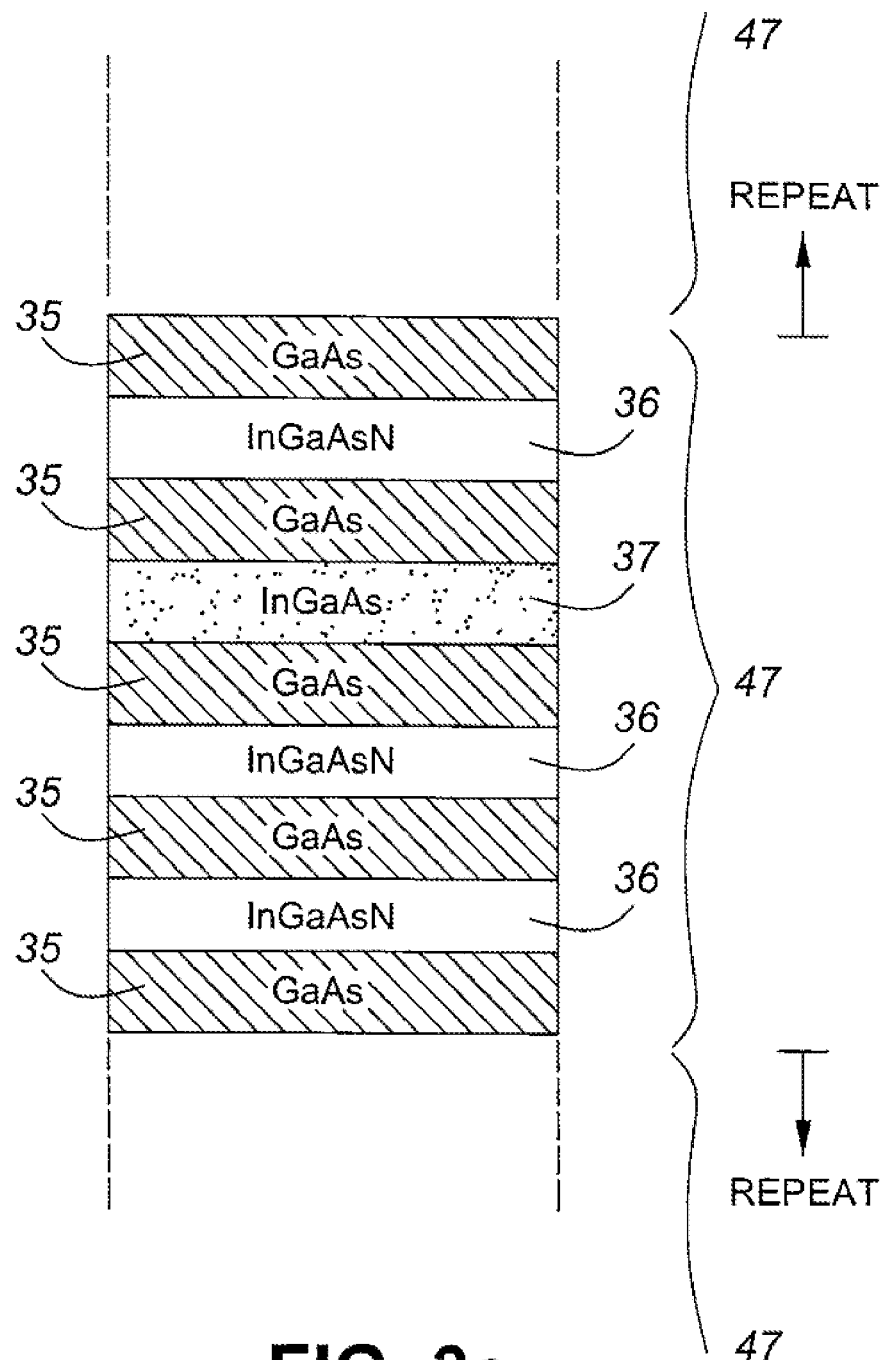

In the example of FIG. 3e the barriers 35 are formed of GaAs. The first type quantum wells 36 are formed of a quaternary InGaAsN material with a lattice constant smaller than that of GaAs, and the second type quantum wells 37 are formed of an InGaAs material having a lattice constant larger than that of GaAs. Three wells of the first type are used for each well of the second type in the repeating structure 47. The intrinsic region of FIG. 3e may be used, for example, in a junction lattice matched to GaAs in which the first and second doped semiconductor regions are also formed of GaAs.

Figure 3F:
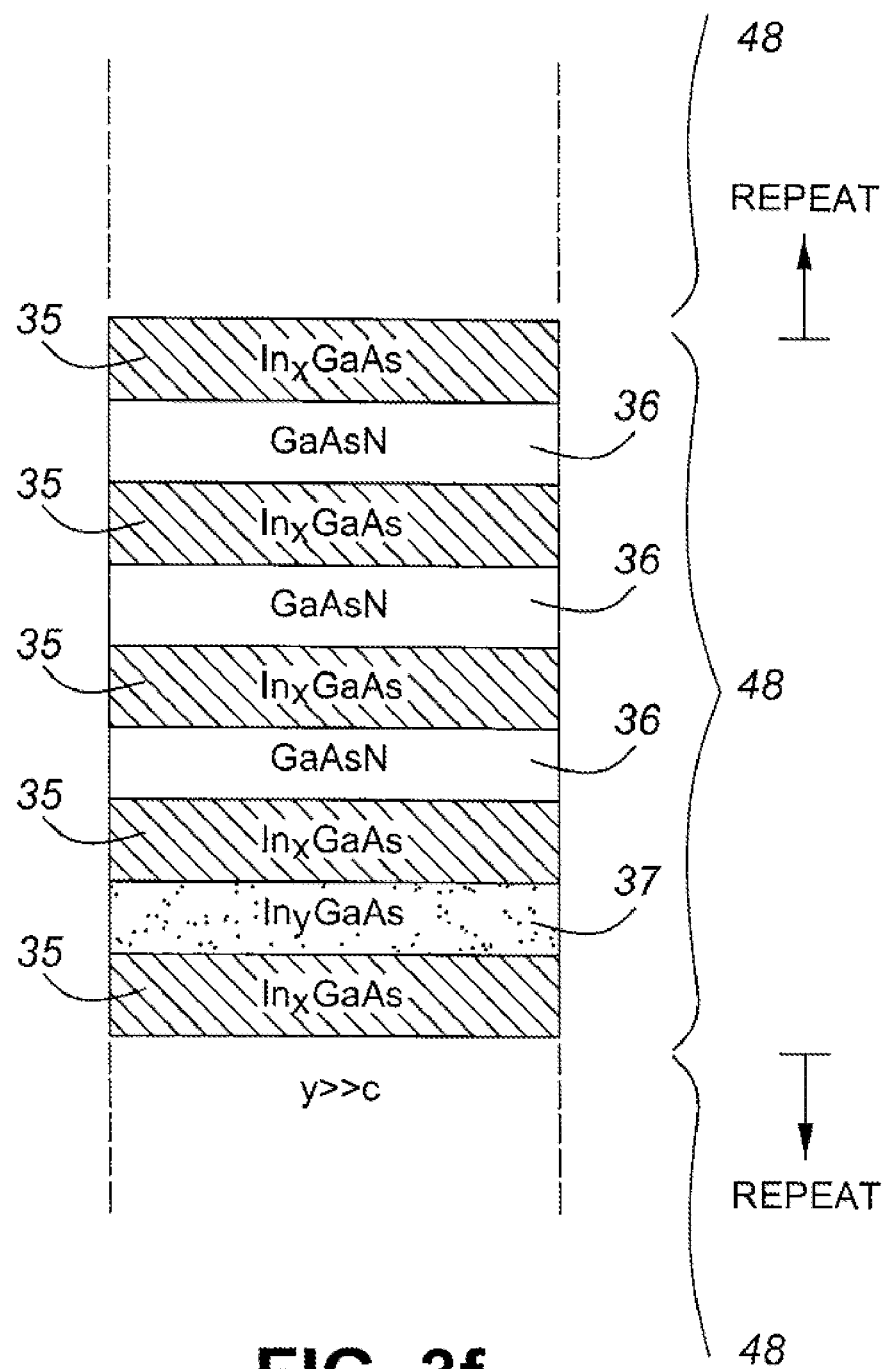

The structure of FIG. 3f can more easily be adapted to other lattice matchings. The barriers are formed from an InGaAs material denoted as $In_xGa_{1-x}As$, whereby the lattice constant of the barriers can be adjusted by selecting a suitable value for x. For example, if $x \approx 1\%$ then the barriers, and the intrinsic region as a whole can be lattice matched to germanium. The repeating structure 48 contains three wells of the first type, and one well of the second type formed of another InGaAs material denoted as $In_yGa_{1-y}As$, where y>x such that the lattice constant of the wells of the second type is larger than the lattice constant of the barriers.

Other variations for forming the wells and barriers of the intrinsic region 30 of FIG. 2 include the addition of aluminium to the wells and/or barriers, including the wells and/or barriers discussed above. In order to lattice match the described structures to substrates other than GaAs, other changes in composition may be made. For example, as already discussed in connection with FIG. 3f, to match to the lattice constant of germanium, for example to use a Ge substrate or a Ge matched virtual substrate, a small amount of indium can be added to barrier layers which would otherwise be lattice matched to GaAs. Alternative materials which could be added to the well and barrier layers include Sb, Bi and Tl.

Figure 4:
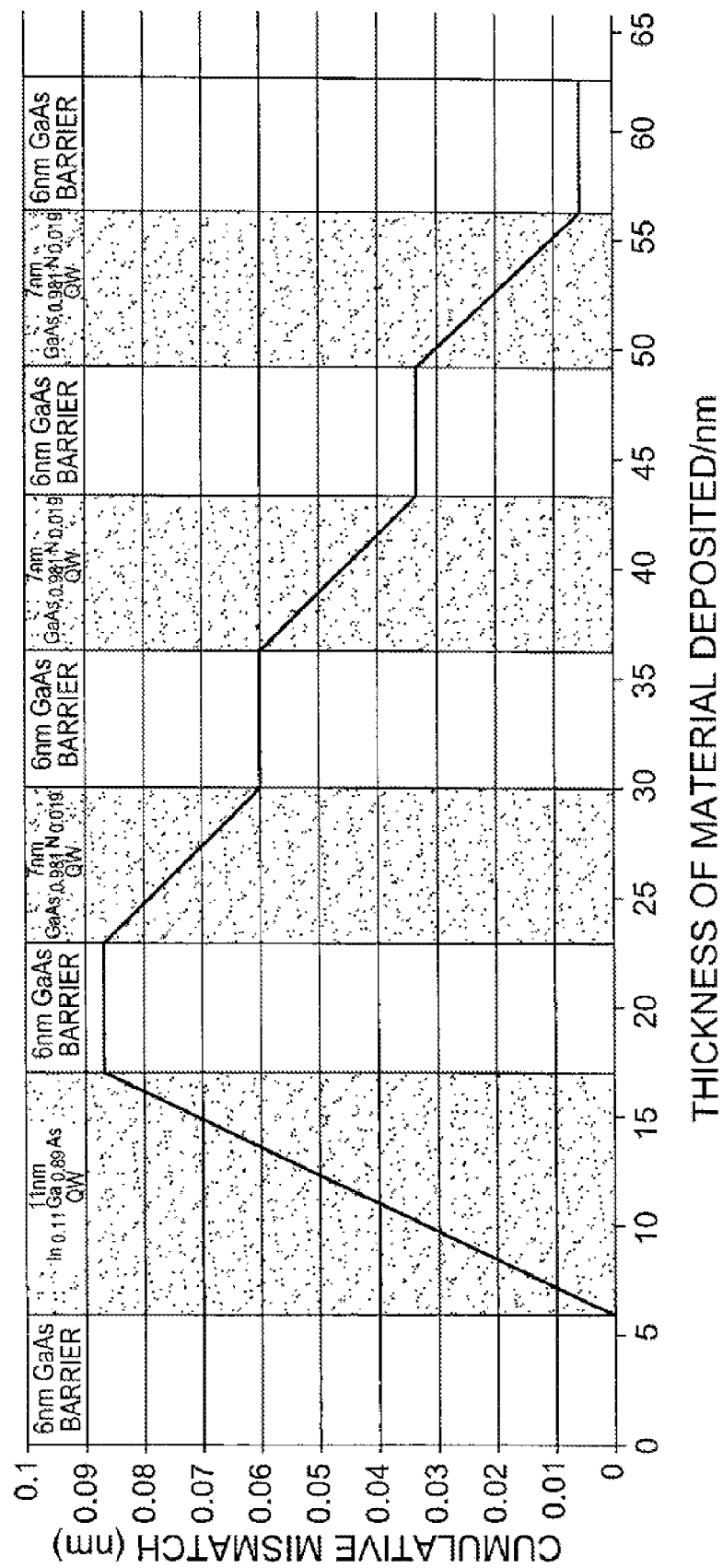

The way in which the stress exerted by the barriers and wells may be balanced across a unit grouping, and across the quantum well stack, is apparent from FIG. 4. The graph shows the lattice mismatch in nanometres which accumulates as barrier and quantum well layers of the first and second types are built up, in this case using the unit grouping structure illustrated in FIG. 3a. It can be seen that the barrier layers, which are formed of GaAs, do not add to the stress in the structure. The wells of the second type, formed of an InGaAs material with a larger lattice constant than GaAs experience compressive stress which is then balanced by the quantum wells of the second type, formed of a GaAsN material. To achieve this stress balance within the constraints of critical growth thicknesses, three wells of the first type are used for each well of the second type.

Some example design rules suitable for choosing the materials and thicknesses of layers for use in an intrinsic region for a photovoltaic junction embodying the invention are set out below. These rules are based on the use of quantum wells of the first type being formed of a dilute nitride material, in particular GaAsN, balanced by wells of the second type formed of a GaInAs material. The barriers are formed of GaAs, lattice matched to the actual lattice size of the photovoltaic junction. The designed photovoltaic junction is for use in a tandem multiple junction solar cell.

1. Select $GaAs_{1-y}N_y$ quantum well composition required to obtain desired absorption edge where $0<y<0.04$.

2. Select $GaAs_{1-y}N_y$ quantum well layer thickness $t_{QW1}$ where $0<t_{QW1}<$critical thickness.

3. Select number of $GaAs_{1-y}N_y$ quantum wells required.

4. Select $Ga_{1-x}In_xAs$ quantum well composition required to obtain desired absorption edge 5. Determine $Ga_{1-x}In_xAs$ quantum well thickness and number of layers required in order to balance the strain of $GaAs_{1-y}N_y$ quantum wells, such that the critical thickness of each $Ga_{1-x}In_xAs$ layer is never exceeded.

6. Design a unit grouping with quantum well layers as determined in (1) to (5) above with alternating quantum wells and GaAs barrier layers, with the quantum well layers arranged in any order.

7. Repeat the unit grouping as many times as required in order to maximise the contribution of the multiple quantum well structure to the internal quantum efficiency of the solar cell as a whole, but up to the limit that the total thickness of the multiple quantum well stack does not exceed 2500 nm.

Another example of a solar cell embodying the invention is shown in FIG. 5a. A substrate 60 incorporates a second photovoltaic junction 62, formed for example by diffusive counterdoping. A nucleation layer 64 on the substrate, and a tunnel junction 66 on the nucleation layer provide an electrical connection between the second photovoltaic junction 62 and a first photovoltaic junction 68 epitaxially grown on the tunnel junction. A window layer 70 is grown on the first junction 68. Electrical current generated in the solar cell is collected using a back contact 72 on the underside of the substrate, and a grid of capping 73 and overlying metallization 74 on top of the window layer 70.

The first photovoltaic junction is provided by a photovoltaic junction as already discussed above in connection with FIG. 1, as illustrated generally in FIG. 2, and as exemplified by the embodiments of FIGS. 3a-3f. In the arrangement of FIG. 5a, the first photovoltaic junction includes: a first doped semiconductor region 76 acting as a base of the junction and a back surface field; a second doped semiconductor region 80 acting as an emitter of the junction; and an intrinsic region 78 disposed between the base and the emitter.

The substrate 60 may typically be between about 3 µm and 1000 µm thick, and may be composed of various materials such as silicon, germanium or GaAs. FIG. 5b illustrates a suitable structure for the intrinsic region 78 when the substrate 60 is of silicon. The repeated unit grouping 84 is formed of barriers 35 made of GaP. The three quantum wells of the first type 36 are of a GaPN material, and the single well of the second type 37 is of a GaInP material. GaP has substantially the same lattice constant as the suggested underlying silicon substrate. The proportion of indium in the second well type may be about 0.1% to 15% for example, balanced by a suitable material composition for the GaPN quantum wells.

When the substrate is of germanium, a suitable structure for the intrinsic region is that already shown in FIG. 3f, with the indium fraction x in the InGaAs barriers being about 0.01, and the indium fraction y in the InGaAs wells of the second type being in the region of 0.15, say between 0.1 and 0.2.

When the substrate is of GaAs, a suitable structure for the intrinsic region is that already shown in FIG. 3b, using barriers of GaAs and quantum wells of GaAsN and InGaAs.

Figure 6:
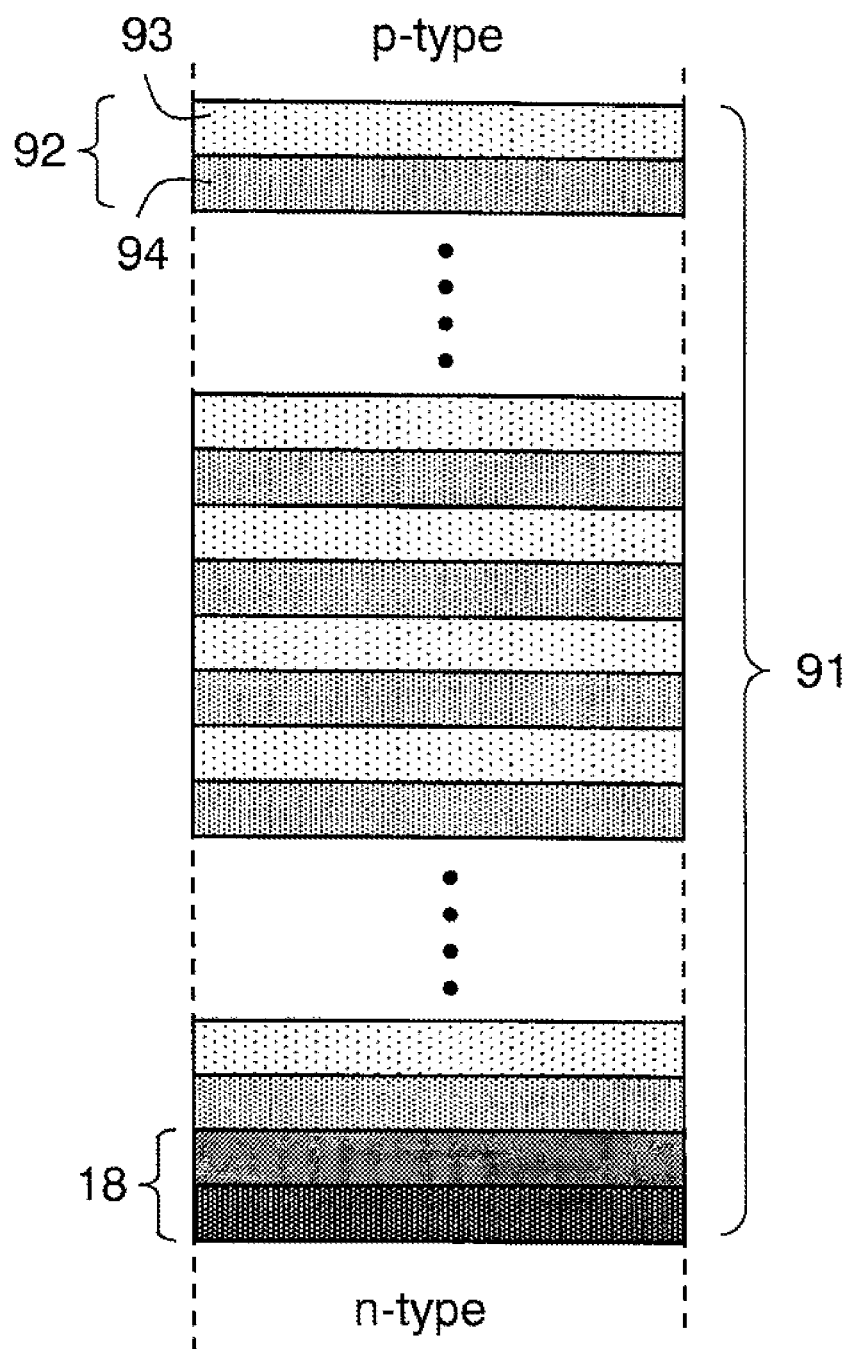
FIG. 6 shows a Bragg reflector incorporated in between the middle and the bottom photovoltaic junctions of the triple-junction cell of FIG. 1.

A semi-conducting reflector, known as a Distributed Bragg Reflector (DBR), may be placed between two adjacent sub-cells of the tandem-junction solar cell of FIG. 1. Referring now to FIG. 6, a DBR 91 includes at least two and preferably between 5 and 20 p-type repeating units 92, each comprised of at least two layers 93, 94 having different refractive indices. The materials and the thicknesses of the layers 93, 94 are selected so that light fields of a pre-defined wavelength band combine constructively when reflected from the multiple interfaces between the layers 93, 94. As a result, both the emission and the unabsorbed incident light within this wavelength band will be reflected back into sub-cells disposed above the DBR 91.

The DBR 91 may typically be made from GaAs/AlGaAs for a Ge or GaAs substrate, although a wide variety of materials may be used, since the layers may be stress-balanced. For example, indium (In) can be added to make the DBR 91 closer to lattice match or even stress-balanced, as may be necessary for growth on a variety of substrates including GaAs, Ge, Si, or InP.

In the configuration shown, the DBR 91 consists of two distinct materials. One of these materials, in particular the material of the top layer 93, may be chosen with a conduction band which is higher in energy than that of the bulk p-type region of a solar cell above it. In this configuration, the DBR 91 will have an additional advantage of acting as a 'back surface field' by reflecting minority carriers and thereby enhancing carrier collection. The bottom-most layer of the DBR may also be heavily doped to form one side of the tunnel junction 18, for facilitating an electrical connection to another photovoltaic junction.

In an alternative configuration, a DBR layer may be placed below a tunnel junction. The DBR layer may be doped n-type, in which case it may serve as a window to an underlying solar cell.

The DBR may fulfil both of the functions above to act as both a window and a surface field if two adjacent DBR layers are heavily doped to form a tunnel junction within the DBR itself.

Figure 7:
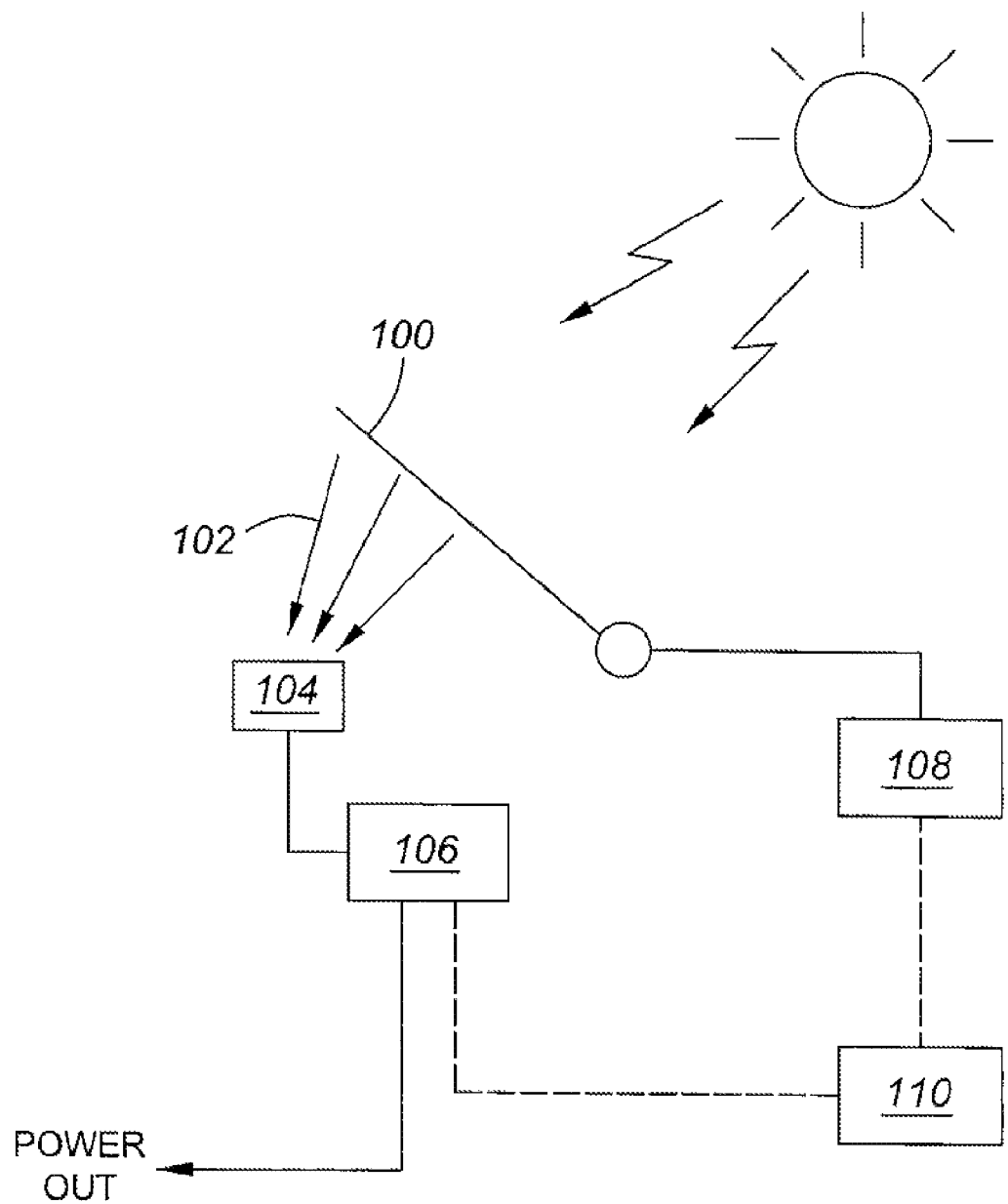
FIG. 7 shows a photovoltaic system for generating electrical power from solar illumination using solar cells comprising one or more photovoltaic junctions embodying the invention.

A photovoltaic system for generating electrical power from solar illumination is illustrated in FIG. 7. A concentrator 100 is arranged to deliver concentrated sunlight 102 to the surface of a solar cell or an array of solar cells 104 embodying the invention, for example as described above. Electrical power is collected from the solar cells by a power controller 106. The concentrator may be directed or driven by a concentrator controller 108, and the elements of the system may be under the common control of a single element such as central processing unit 110. The concentrator may be arranged, for example, to deliver sunlight to the one or more solar cells which has been concentrated by at least a factor of fifty.

A variety of modifications and variations to the arrangements discussed above will be apparent to the skilled person without departing from the scope of the invention. For example, although regular series of quantum wells of the first and second types have generally been discussed, the series may be irregular or varying, and thicknesses of particular layers may vary, and layers of other types may be interposed if required. The barriers may be formed of lattice matched material, but instead may be formed of a material which is not lattice matched, contributing to the overall stress balance of the intrinsic region.

In the detailed examples given above, the wells of the first type have all been of single first material, and the wells of the second type have all been of a single second material, but multiple different materials or small variations on a single material, for example involving small or larger variations in nitrogen and/or indium content may be used in the wells of a single photovoltaic junction. In some such arrangements, some of the quantum wells of the first type may be formed of a different material to others of the quantum wells of the first type, the two (or more) such materials being chosen, for example, to make adjustments to the radiation absorption characteristics of the intrinsic region. Such a scheme may also or alternatively be used for wells of the second type. Thicknesses of the wells of the two materials may similarly be adjusted. Different thicknesses may also be used, in the intrinsic region, for quantum wells of the first type and/or of the second type, for example to adjust radiation absorption characteristics.

Similarly, the material used for the barriers in a single junction may vary slightly or to a larger degree.

The invention claimed is:

1. A monolithic photovoltaic junction for a solar cell, comprising:
    first and second oppositely doped semiconductor regions;
    an intrinsic region disposed between the first and second oppositely doped semiconductor regions, the intrinsic region having an actual lattice size and comprising quantum wells of first and second types and barriers separating each of the quantum wells,
    the quantum wells of the first type being formed of one or more materials having a lattice constant less than the actual lattice size of the intrinsic region, and the quantum wells of the second type being formed of one or more materials having a lattice constant greater than the actual lattice size of the intrinsic region; and
a distributed Bragg reflector, formed of alternate layers of a semiconductor material of differing refractive indices and disposed adjacent to at least one of the first or the second oppositely doped semiconductor regions, for reflecting light, unabsorbed by the quantum wells, towards the quantum wells.

2. The photovoltaic junction of claim 1 wherein the quantum wells of the first and second types and the barriers have compositions and thicknesses such that the quantum wells of the first and second types and the barriers provide compensating compressive and tensile stresses which substantially balance at the actual lattice size of the intrinsic region.

3. The photovoltaic junction of claim 1 wherein the one or more materials of the quantum wells of the first type contain nitrogen or are diluted III-V semiconductor nitride materials.

4. The photovoltaic junction of claim 1 wherein the barriers are formed of materials which are nitrogen free.

5. The photovoltaic junction of claim 1 wherein the one or more materials of the quantum wells of the second type are nitrogen free.

6. The photovoltaic junction of claim 1 wherein
a plurality of quantum wells of the first type are disposed between one or more adjacent pairs of quantum wells of the second type, or
a quantity of wells of the first type is at least twice a quantity of wells of the second type in the intrinsic region.

7. The photovoltaic junction of claim 1, wherein
the barriers have a substantially similar lattice constant as the first and second oppositely doped semiconductor regions, or
the barriers are formed of the same material as the first and second oppositely doped semiconductor regions.

8. The photovoltaic junction of claim 1 wherein
the quantum wells of the first type are formed of one or more GaNAs materials, and
the quantum wells of the second type are formed of one or more InGaAs materials.

9. The photovoltaic junction of claim 1 wherein
the quantum wells of the first type are formed of GaAsN and have an absorption edge of at least 1050 nm,
the quantum wells of the second type are formed of InGaAs and have an absorption edge of at least 900 nm, and the barriers and the first and second oppositely doped semiconductor regions are formed of GaAs,
the quantum wells of the first type are formed of GaAsN and have an absorption edge of at least 900 nm, the quantum wells of the second type are formed of InGaAs and have an absorption edge of at least 1050 nm, and the barriers and the first and second oppositely doped semiconductor regions are formed of GaAs, or
the quantum wells of the first type are formed of GaAsP and have an absorption edge of at least 750 nm, the quantum wells of the second type are formed of GaInP and have an absorption edge of at least 650 nm, and the barriers and the first and second oppositely doped semiconductor regions are formed of a GaInP material.

10. The photovoltaic junction of claim 1 wherein a first and a second quantum well of the intrinsic region are grown to a portion of a thicknesses of other quantum wells of a same type, respectively, in the intrinsic region.

11. The photovoltaic junction of claim 1, further comprising:
a front-surface field layer formed of a material with a first doping and a first bandgap,
at least one of the first doping or the first bandgap being higher than a second doping or a second bandgap, respectively, of the first or the second oppositely doped semiconductor regions,
wherein the front-surface field layer is disposed outside of the first and the second oppositely doped semiconductor regions; and
a back-surface field layer formed of a material with a third doping and a third bandgap,
at least one of the third doping or the third bandgap being higher than the second doping or the second bandgap, respectively,
wherein the back-surface field layer is disposed outside the first or the second oppositely doped semiconductor regions.

12. The photovoltaic junction of claim 1, wherein a layer of the distributed Bragg reflector closest to the first and the second oppositely doped semiconductor regions comprises a material with a first doping and a first bandgap,
at least one of the first doping or the first bandgap being higher than a second doping or a second bandgap, respectively, of the first or the second oppositely doped semiconductor regions, for directing minority carriers back into the intrinsic region.

13. The photovoltaic junction of claim 1, wherein the quantum wells of the first or the second type comprise a first material selected from:
GaAsN, GaPN, GaSbN, InAsN, InPN, InSbN, GaInAsN, GaInPN, GaInSbN, GaInAsPN, GaInAsSbN, GaInPSbN, GaAsPNSb, InAsPNSb, or GaInAsPNSb.

14. The photovoltaic junction of claim 1, wherein the quantum wells of the second type comprise a first material selected from:
GaAs, InAs, GaP, GaSb, InP, InSb, GaAsP, GaPSb, InAsP, InAsSb, InPSb, GaInAs, GaInP, GaInSb, GaAsPSb, InAsPSb, GaInAsP, GaInAsSb, GaInPSb, GaInAsPSb, or GaAsSb.

15. A solar cell comprising a first photovoltaic junction according to claim 1.

16. A photovoltaic system for generating electrical power from solar illumination comprising:
a solar cell according to claim 15; and
a concentrator arranged to deliver concentrated sunlight to a surface of the solar cell.

17. A method of providing an extended absorption edge in a photovoltaic junction which includes an intrinsic region having quantum wells therein, the method comprising:
forming a first subset of the quantum wells from a diluted nitride III-V semiconductor material which is indium free, wherein the first subset of quantum wells are in tensile stress;
forming a second subset of the quantum wells from a material which contains indium, wherein the second subset of quantum wells are in compressive stress; and
separating the quantum wells of the first subset of the quantum wells and the second subset of the quantum wells using barriers which are formed of one or more materials free from both nitrogen and indium,
wherein light, which is unabsorbed by the first subset of the quantum wells and the second subset of the quantum wells, is reflected, by a distributed Bragg reflector formed of alternate layers of a semiconductor material of differing refractive indices, towards the first subset of the quantum wells and the second subset of the quantum wells, and wherein the photovoltaic junction comprises oppositely doped semiconductor regions disposed above and below the intrinsic region.

18. The method of claim 17 wherein
the barriers are formed of GaAs, and
the oppositely doped semiconductor regions being formed of GaAs.

19. A method of forming a solar cell, the method comprising:
epitaxially growing a first doped semiconductor region;
epitaxially growing an intrinsic region on the first doped semiconductor region, the intrinsic region having an actual lattice size and comprising quantum wells of first and second types and barriers separating each of the quantum wells, wherein
the quantum wells of the first type are formed of one or more materials having a lattice constant less than the actual lattice size of the intrinsic region, and
the quantum wells of the second type are formed of one or more materials having a lattice constant greater than the actual lattice size of the intrinsic region; and
epitaxially growing a second doped semiconductor region on the intrinsic region, wherein
the second doped semiconductor region is doped opposite to the first doped semiconductor region, and
light, which is unabsorbed by the quantum wells of the first and second types, is reflected, by a distributed Bragg reflector formed of alternate layers of a semiconductor material of differing refractive indices, towards the quantum wells of the first and second types.

20. The method of claim 19, wherein the quantum wells of the first and second types and the barriers are formed with compositions and thicknesses such that the quantum wells of the first and second types and the barriers provide compensating compressive and tensile stresses which substantially balance at the actual lattice size of the intrinsic region.

21. The method of claim 20, wherein the barriers are formed using materials which are nitrogen free.

22. The method of claim 19, wherein the quantum wells of the first type are formed using materials containing nitrogen or using diluted III-V semiconductor nitride materials.

23. The method of claim 19, wherein
the barriers are formed with a substantially similar lattice constant as the first and second oppositely doped semiconductor regions, or
the barriers are formed of a same material as the first and second oppositely doped semiconductor regions.

24. The method of claim 19, wherein a first and a second quantum wells of the intrinsic region are formed to a portion of a thicknesses of other quantum wells of a same type, respectively, in the intrinsic region.

25. The method of claim 19, wherein the quantum wells of the first or the second type are formed from a material selected from:
GaAsN, GaPN, GaSbN, InAsN, InPN, InSbN, GaInAsN, GaInPN, GaInSbN, GaInAsPN, GaInAsSbN, GaInPSbN, GaAsPNSb, InAsPNSb, or GaInAsPNSb.

26. The method of claim 19, wherein the quantum wells of the second type are formed from a material selected from:
GaAs, InAs, GaP, GaSb, InP, InSb, GaAsP, GaPSb, InAsP, InAsSb, InPSb, GaInAs, GaInP, GaInSb, GaAsPSb, InAsPSb, GaInAsP, GaInAsSb, GaInPSb, GaInAsPSb, or GaAsSb.

* * * * *